(12) United States Patent
Wu

(10) Patent No.: US 10,353,839 B2
(45) Date of Patent: Jul. 16, 2019

(54) SERVER SYSTEM

(71) Applicants: Inventec (Pudong) Technology Corp., Shanghai (CN); Inventec Corporation, Taipei (TW)

(72) Inventor: Xuxiang Wu, Shanghai (CN)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 15/831,491

(22) Filed: Dec. 5, 2017

(65) Prior Publication Data

US 2018/0165237 A1 Jun. 14, 2018

(30) Foreign Application Priority Data

Dec. 14, 2016 (CN) .......................... 2016 1 1151137

(51) Int. Cl.
| | |
|---|---|
| *G06F 13/38* | (2006.01) |
| *G06F 13/40* | (2006.01) |
| *G06F 13/42* | (2006.01) |
| *H05K 7/20* | (2006.01) |
| *G06F 8/65* | (2018.01) |

(Continued)

(52) U.S. Cl.
CPC .......... *G06F 13/385* (2013.01); *G06F 3/0683* (2013.01); *G06F 3/0689* (2013.01); *G06F 8/65* (2013.01); *G06F 13/4022* (2013.01); *G06F 13/4221* (2013.01); *G06F 15/161* (2013.01); *H05K 7/20727* (2013.01); *H05K 7/20836* (2013.01); *G06F 2213/0028* (2013.01)

(58) Field of Classification Search
None
See application file for complete search history.

(56) References Cited

U.S. PATENT DOCUMENTS

| | | | |
|---|---|---|---|
| 2007/0083707 A1* | 4/2007 | Holland | ................ G06F 3/0626 711/114 |
| 2010/0125653 A1 | 5/2010 | Cherian et al. | |

FOREIGN PATENT DOCUMENTS

| | | |
|---|---|---|
| CN | 201418967 A | 5/2014 |
| CN | 201610647 A | 3/2016 |
| CN | 106250051 A | 12/2016 |

OTHER PUBLICATIONS

Office Action dated Oct. 11, 2017; Taiwan Patent Application No. 105143372; Taiwan Intellectual Property Office; Taipei, Taiwan.

* cited by examiner

*Primary Examiner* — Idriss N Alrobaye
*Assistant Examiner* — Dayton Lewis-Taylor
(74) *Attorney, Agent, or Firm* — Stevens & Showalter LLP

(57) ABSTRACT

The present disclosure provides a server system including a rack, a rack management controller, host devices, storage devices and two signal switches. The rack management controller generates a controlling signal. The host devices are located in the rack. The storage devices are electrically connected to the host devices respectively, are disposed in the rack and located under the host devices. The two signal switches are electrically connected to the host devices and the rack management controller respectively, each of the signal switches is electrically connected to the storage devices, and the two signal switches are disposed in the rack and located above the host devices. Each of the host devices receives the control signal through the two signal switches, so as to match one of the storage devices, such that each of the host devices performs the access and process operation for the data of the matched storage device thereof.

9 Claims, 2 Drawing Sheets

(51) Int. Cl.
*G06F 3/06* (2006.01)
*G06F 15/16* (2006.01)

SERVER SYSTEM

CROSS REFERENCE TO RELATED APPLICATION

This application claims priority to Chinese Patent Application 201611151137.2, filed Dec. 14, 2016, the entire contents of which are incorporated herein by reference.

BACKGROUND

Technical Field

The present disclosure is related to a server technical field, and more particular to a server system.

Related Art

In general, the rack server is more balanced in computing, storage and network resources, and has good versatility. In course of development of the server, the rack server takes a very important role.

However, with the scale expansion of business of the internet company, when the traditional rack server performs a certain of resource intensive applications, for example, the application of a large number of storage disks or the application of high performance computation, since the traditional rack server has no focus in computing, storage and network resources, the rack server does not load the above resource intensive application, so as to decrease the working efficiency of the rack server. When the deployment of the rack server needs the application of a large number of storage disks, it needs to customize the storage server for efficiently loading the resource intensive application. When the deployment needs the application of high performance computation, it needs to customize the computation server for efficiently loading the resource intensive application. Thus, a variety of model numbers of rack server models is need to customize, it results in giant cost consumption, and no matter customizing the storage server or customizing the computation server, it needs to separately customize the internal structure of the whole rack, thereby resulting in low application and being not conducive to promoting. Therefore, the design of the server still needs to improve.

SUMMARY

One embodiment of the present disclosure provides a server system, which includes a rack, a rack management controller, a plurality of host devices, a plurality of storage devices and two signal switches. The rack management controller generates a controlling signal. The plurality of host devices are located in the rack. The plurality of storage devices are electrically connected to the host devices respectively, the plurality of storage devices are disposed in the rack and located under the host devices. The two signal switches are electrically connected to the plurality of host devices and the rack management controller respectively, each of the signal switches is electrically connected to the plurality of storage devices, and the two signal switches are disposed in the rack and located above the host devices. Each of the host devices receives the control signal through the two signal switches, and matches with one of the plurality of storage devices, each of the host devices performs the access operation and process operation for the data of the matched storage device thereof.

Each of the two signal switches comprises a temperature register, the rack management controller is electrically connected to the temperature register, so as to receive the chassis temperature information from the temperature register and generate a fan speed adjustment signal according to the chassis temperature information, and the fan speed adjustment signal is transmitted to a fan of the server system through the two signal switches for adjusting the speed of the fan.

The rack management controller receives a working mode adjustment instruction and generates a working mode adjustment signal to the two signal switches according to the working mode adjustment instruction, each of the two signal switches changes the working mode setting data according to the adjustment signal.

Each of the two signal switches includes an electrically erasable programmable read only memory, and the working mode setting data is stored in the electrically erasable programmable read only memory.

The rack management controller receives an updating instruction and updating software of the two signal switches according to the updating instruction.

The rack management controller detects working states of the two signal switches, when one of the two signal switches is in an offline state, the host devices and the storage devices matching with the signal switch of offline state are reallocated to the signal switch of online state through the rack management controller for re-matching with the signal switch of online state, such that the reallocated host devices and storage devices resume the normal working.

Each of the plurality of host devices comprises a host and a host bus adaptor, the host is electrically connected to the storage device and the two signal switches through the host bus adaptor.

The two signal switches are connected to the plurality of host devices and the plurality of storage devices through SCSI.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION

Figure 1:
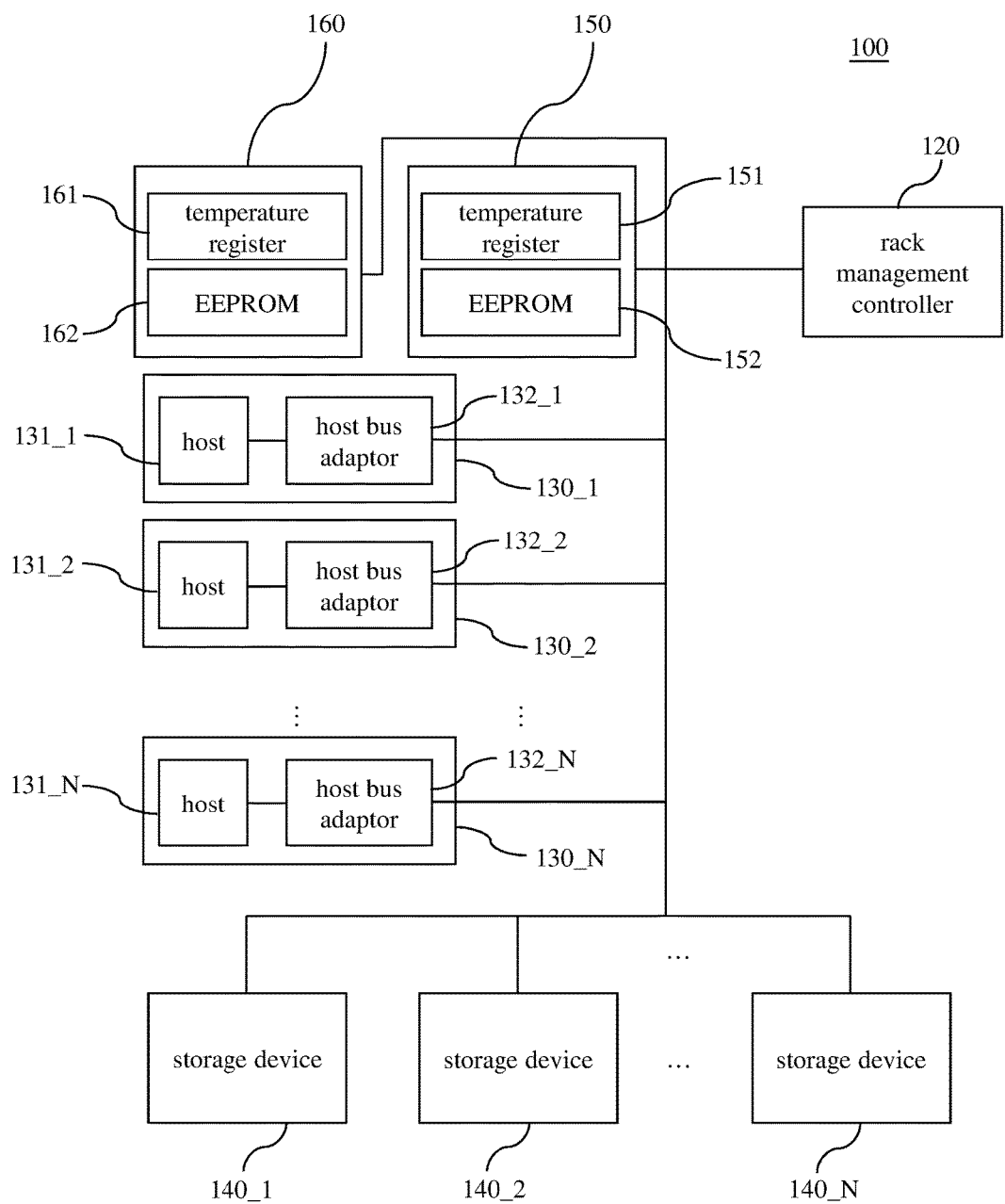
FIG. 1 is a circuit diagram of a server system according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to one embodiment of the present disclosure, the two signal switches are electrically connected to the rack management controller, the plurality of host devices and the plurality of storage devices, and controls the matching relationship of the host devices and the storage devices according to the controlling signal generated by the rack management controller, so as to flexibly and elastically adjust the host devices to match with the storage devices according to the different business characteristics, thereby efficiently improving the operation efficiency of the server system.

According to one embodiment of the present disclosure, a server system is provided. Referring to the contents shown in FIGS. 1 and 2, the server system 100 includes a rack 110, a rack management controller 120, a plurality of host devices 130_1~130_N, a plurality of storage devices 140_1~140_N and two signal switches 150,160, wherein N is a positive integer greater than 1.

The rack management controller 120 generates a controlling signal, so as to control the operation among the two signal switches 150, 160, the host devices 130_1~130_N and the storage devices 140_1~140_N.

The plurality of host devices 130_1~130_N are located in the rack 110. Further, the host devices 130_1~130_N are sequentially arranged in the rack 110 from the top to the bottom, and the host devices 130_1~130_N are arranged in parallel.

The plurality of storage devices 140_1~140_N are electrically connected to the host devices 130_1~130_N respectively, the plurality of storage devices 140_1~140_N are disposed in the rack 110 and located under the host devices 130_1~130_N. Further, the storage devices 140_1~140_N are, for example, located at bottom of the host device 130_N, i.e. the bottom of the rack 110. In the embodiment, each of the plurality of storage devices 140_1~140_N is a SAS JBOD storage device.

The two signal switches 150, 160 are electrically connected to the plurality of host devices 130_1~130_N and the rack management controller 120 respectively, each of the signal switches 150, 160 is electrically connected to the plurality of storage devices 140_1~140_N, and the two signal switches 150, 160 are disposed in the rack 110 and located above the host devices 130_1~130_N, i.e. above the interior of the rack 110. In the embodiment, each of the two signal switches 150, 160 is, for example, a SAS switch.

Each of the host devices 130_1~130_N receives the control signal through the two signal switches 150, 160, so as to match one of the plurality of storage devices 140_1~140_N, such that each of the host devices 130_1~130_N performs the access and process operation for the data of the matched storage device thereof.

For example, in some embodiments, the controlling signal generated by the rack management controller 120 includes the host device 130_1 matched with the storage devices 140_1, 140_2, the host devices 130_2, 130_3 matched with the storage device 140_3, the host device 130_4 matched with the storage devices 140_4, 140_5, 140_6, and this controlling signal is sent to the signal switch 150. The signal switch 150 receives the above controlling signal and transmits the controlling signal to the host devices 130_1, 130_2, 130_3, 130_4, such that the host device 130_1 searches the storage device 140_1, 140_2 for matching according to the controlling signal, the host devices 130_2, 130_3 searches the storage device 140_3 for matching according to the controlling signal, and the host device 130_4 searches the storage devices 140_4, 140_5, 140_6 for matching according to the controlling signal.

Then, the host device 130_1 may perform the access and process operation for the data of the matched storage device thereof (i.e. the storage devices 140_1, 140_2). The host devices 130_2, 130_3_1 may perform the access and process operation for the data of the matched storage device thereof (i.e. the storage device 140_3). The host device 130_4 may perform the access and process operation for the data of the matched storage device thereof (i.e. the storage devices 140_4, 140_5, 140_6).

In a specific embodiment, the host device 130_1, 130_2 and the storage device 140_1, 140_2, . . . , 140_12 are disposed in the rack 110, the rack management controller 120 generates the controlling signal and transmits the controlling signal to the host device 130_1, 130_2 through the signal switches 150, 160. The host device 130_1 matches with six storage devices 140_1, 140_2, . . . , 140_6 according to the controlling signal, so as to perform the access and process operation for the data of the matched storage devices. The host device 130_2 matches with six storage devices 140_7, 1140_8, . . . , 140_12 according to the controlling signal, so as to perform the access and process operation for the data of the matched storage devices.

The above embodiment is only one embodiment of the present disclosure, but does not limit the present disclosure. According to the requirement (for example, the application requirement of a large number of storage disks or the application requirement of high performance computation) of the user, the disposing relationship and the disposing number of the host devices 130_1~130_N and the storage devices 140_1~140_N may be adjusted. The embodiment of other matching relationships of the host devices 130_1~130_N and the storage device 140_1~140_N may refer to the above embodiment, and the description thereof is omitted.

According to the above description, the rack management controller 120 generates the controlling signal, such that the signal switches 150, 160 may adjust the matching relationship of the host devices 130_1~130_N and the storage devices 140_1~140_N, so as to flexibly and elastically adjust the host devices to match with the storage devices according to the different business characteristics. That is, when there is a high requirement for the computing performance and access delay, the number of the host devices may be correspondingly increased and the number of the storage devices may be correspondingly decreased. When there is a requirement for the storage capacity of the disk, the number of the host devices may be correspondingly decreased and the number of the storage devices may be correspondingly increased. Therefore, the operation efficiency of the server system 100 may be efficiently increased.

Figure 2:
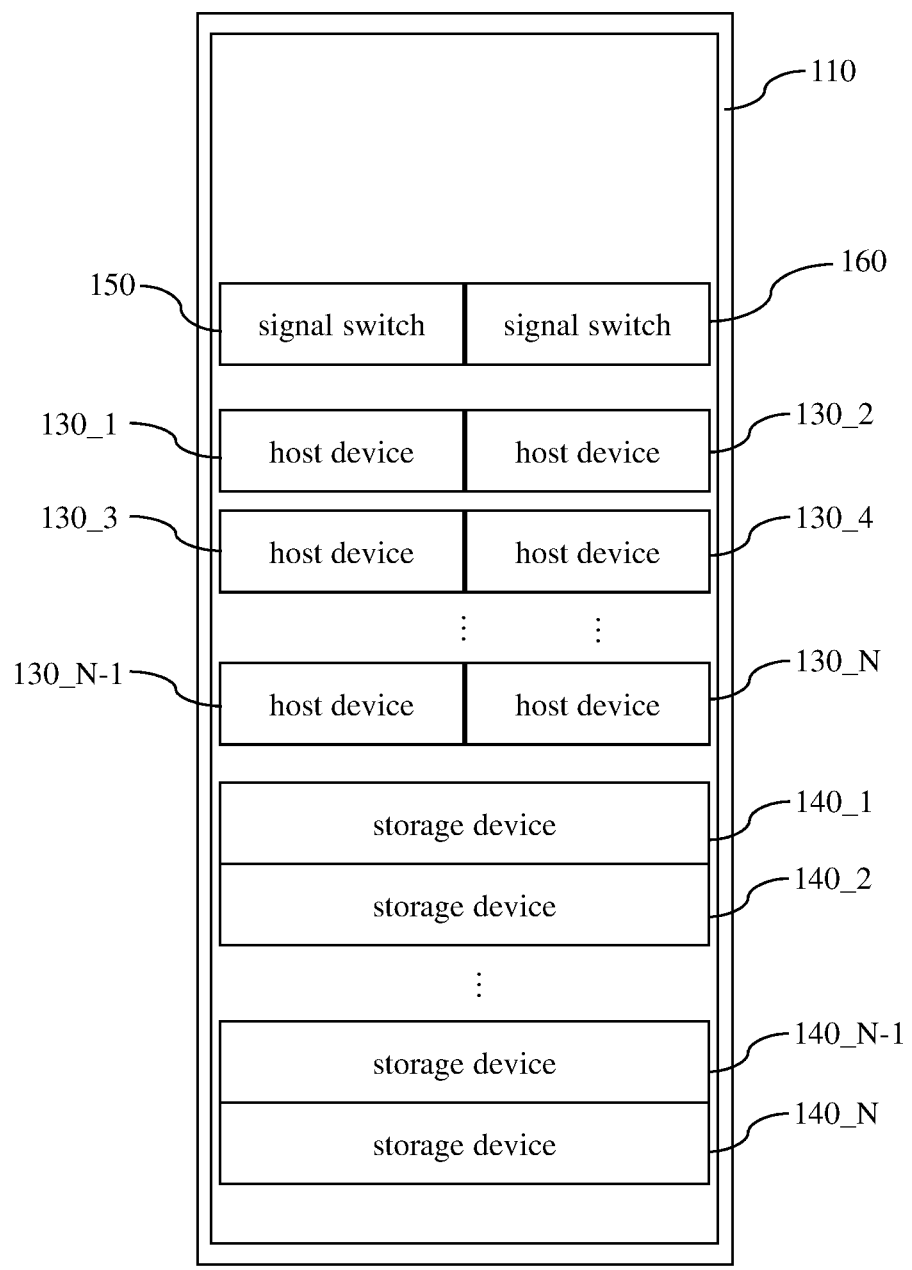
FIG. 2 is a structure diagram of a server system according to an embodiment of the present disclosure.

Additionally, referring to FIG. 1, the two signal switches 150, 160 may respectively include a temperature register 151, 161. The rack management controller 120 is electrically connected to the temperature registers 151, 161 so as to receive the chassis temperature information from the temperature registers 151, 161 and generate a fan speed adjustment signal according to the chassis temperature information. Then, the rack management controller 120 outputs the fan speed adjustment signal to a fan of the server system 100 though the two signal switch 150, 160, so as to adjust the speed of the fan.

That is, the two signal switches 150, 160 may monitor the chassis temperature inside the rack 110, and store the chassis temperature in the temperature registers 151, 161. The rack management controller 120 may read the chassis temperature information of the temperature register 151, 161, so as to generate the corresponding fan speed adjustment signal according to the chassis temperature information. For example, when the rack management controller 120 determines that the temperature of the chassis temperature information is higher than a temperature threshold, the rack management controller 120 generates the fan speed adjustment signal for increasing the fan speed. Then, the rack management controller 120 outputs the fan speed adjustment signal for increasing the fan speed to the fan of the server system 100, so as to increase the speed of the fan, thereby efficiently decreasing the temperature inside the rack 100.

When the rack management controller 120 determines that the temperature of the chassis temperature information is equal to or lower than the temperature threshold, the rack management controller 120 generates the fan speed adjustment signal for increasing the fan speed. Then, the rack management controller 120 outputs the fan speed adjustment signal for decreasing the fan speed to the fan of the server system 100, so as to decrease the speed of the fan, thereby efficiently decreasing the power consumption of the server system 100.

Furthermore, the rack management controller 120 may further receives a working mode adjustment instruction and generates a working mode adjustment signal to the two signal switches 150, 160 according to the working mode adjustment instruction, such that each of the two signal switches 150, 160 changes the working mode setting data thereof according to the adjustment signal. Each of the two signal switches 150, 160 includes an electrically erasable programmable read only memory (EEPROM) 152, 162, and the working mode setting data is stored in the electrically erasable programmable read only memory 152, 162.

That is, the maintenance engineer may remotely send the working mode adjustment instruction to the rack management controller 120, such that rack management controller 120 correspondingly generates the working mode adjustment signal to the two signal switches 150, 160, so as to adjust the working mode setting of the signal switches 150, 160. The rack management controller 120 may further receives, for example, an updating instruction sent by the maintenance engineer, and updating software of the two signal switches 150, 160 according to the updating instruction. Therefore, the working efficiency of the server system 100 may be efficiently increased, and the convenience of the usage is increased.

Further, the rack management controller 120 may detect working states of the two signal switches 150, 160, so as to adjust the operation of the server system 100 according to the working states of the signal switches 150 160. When the working state of one (such as the signal switch 150) of the two signal switches 150, 160 is in an offline state, the host devices and the storage devices matched with the signal switch (such as the signal switch 150) of offline state are reallocated to the signal switch (such as the signal switch 160) of online state through the rack management controller 120 for re-matching with the signal switch (such as the signal switch 160) of online state, such that the reallocated host devices and storage devices resume the normal working.

In some embodiment, when the working state of the signal switch 150 is the offline state, the host devices 130_1, 130_2, 130_3, 130_4 and the storage devices 140_1, 140_2, 140_3, 140_4, 140_5, 140_6 may be reallocated to the signal switch 160 of online state through the rack management controller 120, such that the signal switch 160 substitutes the signal switch 150 and transmits the controlling signal. Therefore, according to the controlling signal transmitted by the signal switch 160, the host device 130_1 matches with the storage devices 140_1, 140_2 the host devices 130_2, 130_3 match with the storage device 140_3, and the host device 130_4 similarly matches with the storage device 140_4, 140_5, 140_6, such that re-matched host device 130_1 and storage device 140_1, 140_2 resume the normal working, the re-matched host devices 130_2, 130_3 and storage device 140_3 resume the normal working, and the re-matched host device 130_4 and storage devices 140_4, 140_5, 140_6 resume the normal working. Therefore, when the working state of one of the two signal switches 150, 160 is an offline state, the working efficiency of the server system 100 is not affected and the server system 100 still works normally, thereby increasing the working efficiency of the server system 100 and increasing the convenience of the usage.

Further, in the embodiment, each of the plurality of host devices 130_1~130_N includes, for example, a host 131_1~131_N and a host bus adaptor 132_1~132_N. The hosts 131_1~131_N are electrically connected to the storage devices 140_1~140_N and the two signal switches 150, 160 through the host bus adaptors 132_1~132_N. The two signal switches 150, 160 are connected to the plurality of host devices 130_1~130_N and the plurality of storage devices 140_1~140_N through SCSI.

In summary, according to the technical solution of the present disclosure, the two signal switches are electrically connected to the rack management controller, the plurality of host devices and the plurality of storage devices, and controls the matching relationship of the host devices and the storage devices according to the controlling signal generated by the rack management controller, so as to flexibly and elastically adjust the host devices to match with the storage devices according to the different business characteristics, thereby expanding the scope of the server system, and efficiently improving the operation efficiency of the server system. Additionally, the speed of the fan of the server system may further be adjusted according to the chassis temperature information, so as to efficiently decrease the temperature insides the rack or decrease the power consumption of the server system. Furthermore, the rack management controller may further detect working states of the two signal switches, such that when the working state of one of the two signal switches is an offline state, the host devices and the storage devices matched with the signal switch of offline state are reallocated to the signal switch of online state, such that the re-matched host devices and storage devices resume the normal working, thereby increasing the working efficiency of the server system and increasing the convenience of the usage.

Although the present disclosure is illustrated and described with reference to specific embodiments, those skilled in the art will understand that many variations and modifications are readily attainable without departing from the spirit and scope thereof as defined by the appended claims and their legal equivalents.

What is claimed is:

1. A server system, comprising:
a rack;
a rack management controller, generating a controlling signal;
a plurality of host devices, located in the rack;
a plurality of storage devices, electrically connected to the host devices respectively, the plurality of storage devices disposed in the rack and located under the host devices; and
two signal switches, electrically connected to the plurality of host devices and the rack management controller respectively, each of the signal switches electrically connected to the plurality of storage devices, and the two signal switches disposed in the rack and located above the host devices;
wherein each of the host devices receives the control signal through the two signal switches and matches with one of the plurality of storage devices, each of the host devices performs the access operation and process operation for the data of the matched storage device thereof; and wherein each of the two signal switches comprises a temperature register, the rack management controller is electrically connected to the temperature register, so as to receive the chassis temperature information from the temperature register and generate a fan speed adjustment signal according to the chassis temperature information, and the fan speed adjustment signal is transmitted to a fan of the server system through the two signal switches for adjusting the speed of the fan.

2. The server system according to claim 1, wherein the rack management controller receives a working mode adjustment instruction, and generates a working mode adjustment signal to the two signal switches according to the working mode adjustment instruction, each of the two signal switches changes the working mode setting data according to the adjustment signal.

3. The server system according to claim 2, wherein each of the two signal switches comprises an electrically erasable programmable read only memory, and the working mode setting data is stored in the electrically erasable programmable read only memory.

4. The server system according to claim 1, wherein the rack management controller receives an updating instruction and updating software of the two signal switches according to the updating instruction.

5. The server system according to claim 1, wherein the rack management controller detects working states of the two signal switches, when the one of the two signal switches is in an offline state, the host devices and the storage devices matched with the signal switch of offline state are reallocated to the signal switch of online state through the rack management controller for re-matching with the signal switch of online state, such that the reallocated host devices and storage devices resume the normal working.

6. The server system according to claim 1, wherein each of the plurality of storage devices is a SAS JBOD storage device.

7. The server system according to claim 1, wherein each of the plurality of host devices comprises a host and a host bus adaptor, the host is electrically connected to the storage device and the two signal switches through the host bus adaptor.

8. The server system according to claim 1, wherein the two signal switches are SAS switches.

9. The server system according to claim 1, wherein the two signal switches are connected to the plurality of host devices and the plurality of storage devices through SCSI.

* * * * *